United States Patent [19]

van den Berg et al.

[11] 4,307,337

[45] Dec. 22, 1981

[54] METHOD AND APPARATUS FOR CAPACITIVELY MEASURING VARIATIONS IN THE NOMINAL DISTANCE BETWEEN A COLOR SELECTION ELECTRODE AND A DISPLAY WINDOW OF A TELEVISION DISPLAY TUBE

[75] Inventors: Jacob van den Berg, Eindhoven, Netherlands; Rolf Schmidt, Roetgen-Rott, Fed. Rep. of Germany

[73] Assignee: U.S. Philips Corporation, New York, N.Y.

[21] Appl. No.: 90,963

[22] Filed: Nov. 5, 1979

[30] Foreign Application Priority Data

Dec. 18, 1978 [NL] Netherlands ........................ 7812247

[51] Int. Cl.[3] ............................................ G01R 27/26

[52] U.S. Cl. ................................................ 324/61 R

[58] Field of Search ........................... 324/61 R, 61 P

[56] References Cited

U.S. PATENT DOCUMENTS 2,802,178 8/1957 Shafer et al. ...................... 324/61 R
3,031,617 4/1962 Paquette .......................... 324/61 R
3,077,858 2/1963 Ulug ................................ 324/61 P
3,400,331 9/1968 Harris .............................. 324/61 R
3,626,287 12/1971 DiNiro ............................ 324/61 R
3,805,150 4/1974 Abbe ............................... 324/61 R
3,825,323 7/1974 Landwer ..................... 324/61 R X

*Primary Examiner*—Stanley T. Krawczewicz
*Attorney, Agent, or Firm*—Thomas A. Briody; William J. Streeter; Algy Tamoshunas

[57] ABSTRACT

The invention relates to a method of determining variations in the previously adjusted nominal distance between the facing surfaces of a color selection electrode and a display window of a color television display tube in places situated near the corners of the display window. In this method the capacitance variations in that distance are determined by measuring a capacitor one electrode of which is formed by the color selection electrode and the other electrode is formed by a measuring electrode surrounded by a screening electrode, the measuring electrode being provided on the outer surface of the display window. By eccentrically moving the measuring electrode in a direction towards the corner of the display window relative to the screening electrode and by a suitable choice of the outside dimensions of the screening electrode, capacitance variations as a result of glass thickness variations in the display window are made negligibly small with respect to the capacitance variations due to variations in the previously adjusted nominal distance between the facing surfaces of the color selection electrode and the display window.

8 Claims, 5 Drawing Figures

Figure 1:
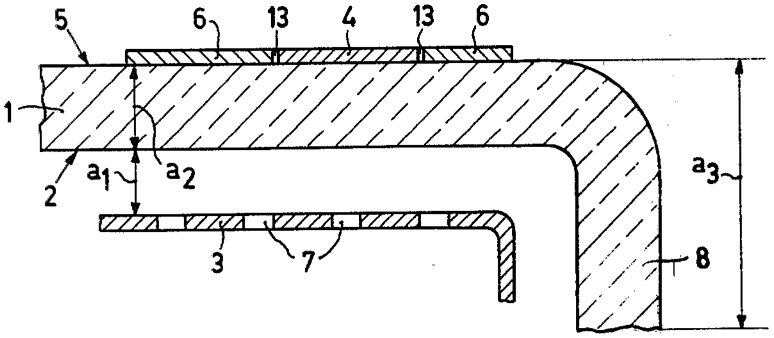

METHOD AND APPARATUS FOR CAPACITIVELY MEASURING VARIATIONS IN THE NOMINAL DISTANCE BETWEEN A COLOR SELECTION ELECTRODE AND A DISPLAY WINDOW OF A TELEVISION DISPLAY TUBE

The invention relates to a method of determining variations in the previously adjusted nominal distance between the facing surfaces of a colour selection electrode and a substantially rectangular display window of a colour television display tube having an upright edge in places situated near the corners of the display window. The invention also relates to a device for carrying out the method.

Non-electrical quantities, for example distances, can be measured electrically by means of capacitance determinations. This method is difficult in particular in the case of the determination of small distance. In the book by Kautsch "Messelektronik nicht-elektrischer Grössen" (Measuring electronics of non-electrical quantities), volume 3, pp. 98, 99, the principle is explained of the measurement of the layer thickness of a dielectric and a formula is derived for the capacity of a measuring capacitor which is filled with two dielectrics.

It is furthermore known from the book by F. Kohlrausch "Praktische Physik" (Practical Physics), volume 2, p. 237 to use for the accurate measurement of the dielectric properties of plate-shaped insulators, a so-called screening capacitor of which one capacitor plate is a metal plate and the other is a circular electrode surrounded by a screening ring or a plate-shaped electrode surrounded by a screening electrode.

A measuring capacitor of which one capacitor plate is fully surrounded by a screening electrode and which is used for the determination of very small capacitance variations is furthermore known from German Auslegeschrift No. 2,041,044.

As described in the above-mentioned book by Kautsch, the capacitance C between a measuring electrode and a metal plate is inversely proportional to the distance a between the measuring electrode and the metal plate. This means that a variation in the distance a also results in a capacitance variation because in fact it holds that:

$$C=(\epsilon\epsilon_0 F/a) \quad (1)$$

where $\epsilon$ is the dielectric constant of the medium between the plates and F is the area of the measuring electrode. So by measuring the capacitance, the distance a is directly obtained. The measurement is more accurate when the medium between the actual measuring electrode and the opposite electrode is more homogeneous. When a screening electrode is used which may consist, for example, of an annular thin metal plate, a substantially homogeneous measuring field is obtained. The distance between the measuring electrode and the screening electrode should be chosen to be as small as possible in order that at that area no inhomogeneous edge disturbances may occur.

In the case in which the measuring space is filled with two different dielectrics formed by plane parallel plates, in which one dielectric has a dielectric constant $\epsilon_1$ and a layer thickness $a_1$ and the other dielectric has a dielectric constant $\epsilon_2$ and a layer thickness $a_2$, it holds for the overall capacitance that:

$$C_t=C_1C_2/(C_1+C_2)$$

where $C_1=\epsilon_0\epsilon_1 F/a_1$ and $C_2=\epsilon_0\epsilon_2 F/a_2$
From this it follows that $$\epsilon_0 F/C_t=(a_1/\epsilon_1)\,(1+a_2\epsilon_1/a_1\epsilon_2) \quad (2)$$

The distance $a_1$ is then given by:

$$a_1=\epsilon_1(\epsilon_0 F/C_t-a_2/\epsilon_2) \quad (3)$$

Such a configuration of two dielectrics occur in the manufacture of colour television display tubes having a colour selection electrode arranged at a short distance from a glass display window. One dielectric is formed by the glass display window and the other dielectric is formed by the medium which is present between the facing surface of the glass display window and the colour selection electrode. In the manufacture of a colour television display tube it is of importance for a good colour display to establish accurately whether the distance between the facing surfaces of the display window and the colour selection electrode corresponds to the previously adjusted nominal distance. It has proved possible to determine this distance between colour selection electrode and display window by means of a capacitive method. In this method one electrode of the capacitor is formed by the colour selection electrode and the other electrode is formed by a metal measuring electrode. The measuring electrode is provided on the surface of the display window remote from the colour selection electrode and is surrounded by a metal screening electrode. In the above formula (3) this distance is equal to $a_1$ and the glass thickness of the display window is equal to $a_2$. The distance $a_1$ can be measured accurately only if the distance $a_2$ is accurately known.

However, in a display window of a colour television display tube variations in the glass thickness occur, which causes variations in the measured distance between the colour selection electrode and the display window. As follows from the above formula (3), with an $\epsilon_1=1$ (air) and $\epsilon_2\approx 7$ (glass), a variation in the glass thickness of, for example, 1 mm causes an error of approximately 140 $\mu$m in the measured distance between the colour selection electrode and the display window. However, a better accuracy is required for the determination of the distance in the manufacture of a colour television display tube.

It must be possible to establish deviations of approximately 30 $\mu$m with respect to the previously adjusted nominal distance between the colour selection electrode and the display window. Upon measuring the distance near the corners of the display window, particular problems occur as a result of the finite extent of the colour selection electrode and the upright edge of the glass display window.

It is the object of the invention to provide a method of capacitively determining the distance between the facing surfaces of a display window and a colour selection electrode near the corners of the display window, in which the error as a result of variations in the glass thickness is minimum and moreover the error as a result of the finite extent of the colour selection electrode is minimized.

According to the invention, a method of determining variations in the previously adjusted nominal distance between the facing surfaces of the colour selection electrode and a substantially rectangular display window of a colour television display tube having an upright edge in places situated near the corners of the display window, is characterized in that the distance is measured capacitively by means of a capacitor, one electrode of which is formed by the colour selection electrode and the other electrode is formed by a metal measuring electrode. The measuring electrode is provided near a corner of the window on the surface of the display window remote from the colour selection electrode and is surrounded by a metal screening electrode. Further, the measuring electrode is arranged in a direction towards the corner of the display window, eccentrically with respect to the screening electrode whose outside dimensions have a value such that variations of the nominal glass thickness of the display window up to at most 15% result in a capacitance variation of the capacitor which is negligible with respect to the capacitance variation due to distance variations in the previously adjusted nominal distance between the facing surfaces of the colour selection electrode and the display window. Negligible is to be understood to mean herein that a capacitance variation which corresponds to a distance variation of approximately 30 μm in the nominal distance between the facing surfaces of the display window and the colour selection electrode can be recognized as such. This means that a capacitance variation as a result of a variation of 15% in the glass thickness is smaller than a capacitance variation as a result of a variation of approximately 30 μm with respect to the nominal distance between colour selection electrode and display window.

The invention is based on the recognition gained by research that the inhomogenity of the electric field between the measuring electrode and the colour selection electrode influences the error in the distance to be measured between the facing surfaces of the display window and the colour selection electrode. The inhomogeneity of the measuring field is determined, on the one hand, by the outside dimensions of the screening electrode and, on the other hand, by the finite extent of the colour selection electrode and the height of the upright edge of the display window. It has been found that by correctly using the extent of inhomogeneity the error in the distance to be measured between the facing surfaces of the display window and the colour selection electrode as a result of glass thickness variations can be minimized. The extent of inhomogeneity is determined by a correct choice of the outside dimensions of the screening electrode and the eccentric location of the measuring electrode with respect to the screening electrode.

According to an embodiment of the invention a geometric shape is chosen for the measuring electrode and the screening electrode, which shape is symmetrical with respect to the bisector of the corner of the display window where the elctrodes are arranged, the strip formed by the circumference of the screening electrode and the circumference of the measuring electrode narrowing in the direction towards the corner of the display window.

Circular or substantially circular electrodes are preferably chosen for the measuring electrode and the screening electrode.

For a given nominal glass thickness of the display window between approximately 8 and 16 mm and a given height of the upright edge of the display window between approximately 30 and 60 mm, the diameter of the metal screening electrode is chosen to be increasing linearly or substantially linearly with the previously adjusted nominal distance between the facing surfaces of the display window and the colour selection electrode between approximately 5 and 20 mm, and the eccentricity of the measuring electrode with respect to the screening electrode is determined by a given nominal glass thickness and a given height of the upright edge, which eccentricity is substantially independent of the diameter of the metal screening electrode.

A device for carrying out the method comprises at least one assembly of electrodes, which assembly is formed by a measuring electrode and a screening electrode, the measuring electrode being arranged eccentrically with respect to the screening electrode.

Variations of approximately 30 μm in the nominal distance between the facing surfaces of the display window and the colour selection electrode can be determined by means of a method according to the invention.

Figure 2:
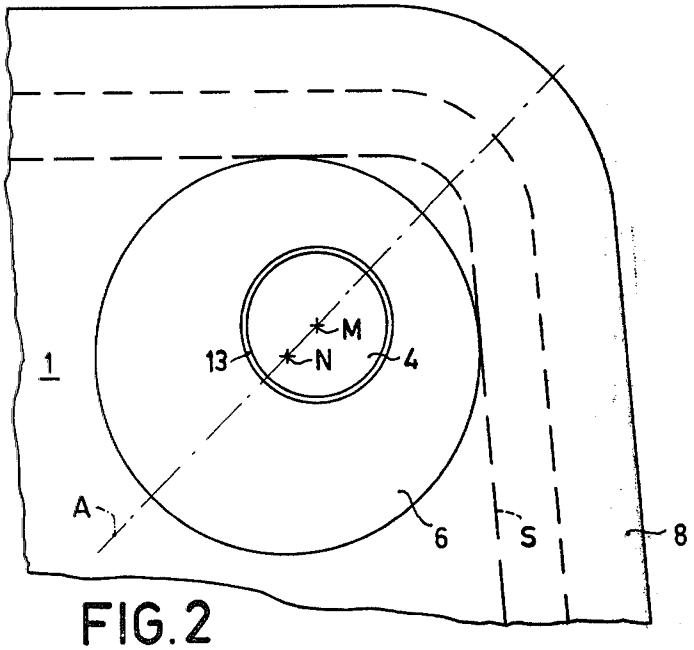
Figure 3:
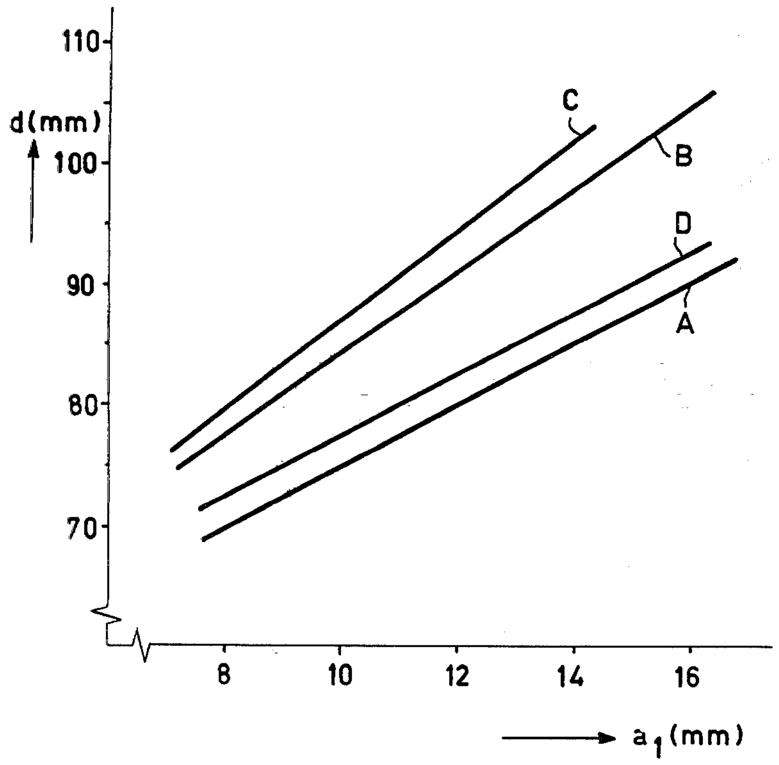
Figure 4:
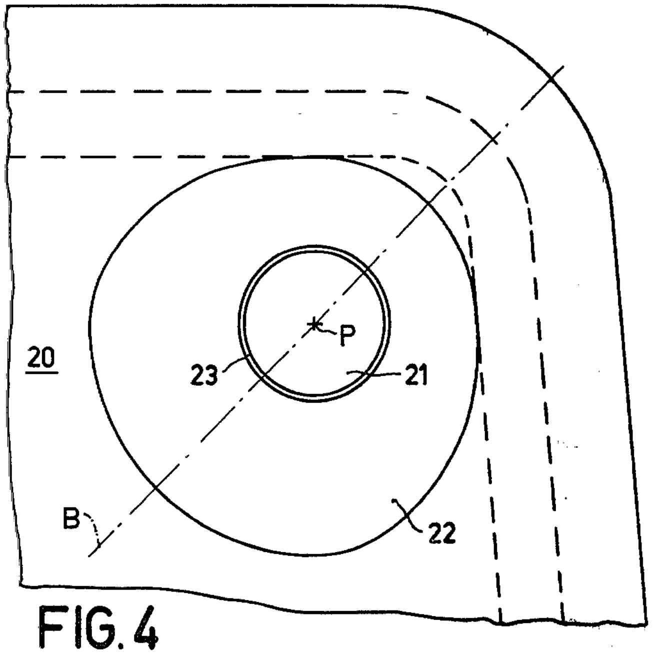
Figure 5:
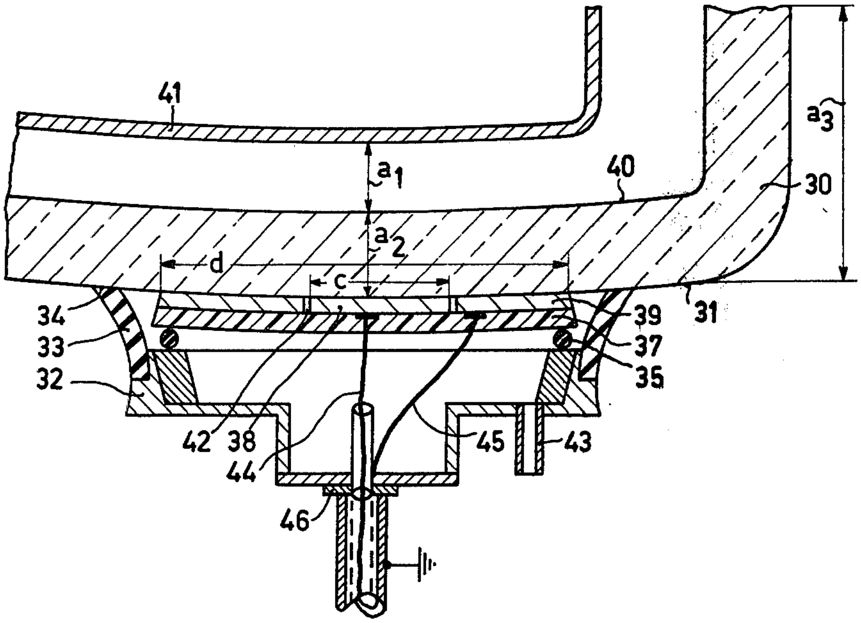

The invention will now be described in greater detail, by way of example, with reference to the accompanying drawing, of which FIG. 1 illustrates the principle of the method according to the invention, FIG. 2 is a plan view of an embodiment of a measuring electrode and a screening electrode according to the arrangement of FIG. 1, FIG. 3 shows the relationship between the outside dimensions d of the screening electrode and the distance $a_1$ for the embodiment shown in FIG. 2 for various nominal glass thicknesses and heights of the upright edge of the display window, FIG. 4 shows another embodiment of a measuring electrode and a screening electrode in accordance with the invention, and FIG. 5 is a sectional view of a device for carrying out a method in accordance with the invention.

FIG. 1 shows a part of a sectional view along a diagonal of a display window 1 having an upright edge 8 of a colour television display tube. The thickness $a_2$ of the display window 1 is 12 mm. The height $a_3$ of the upright edge 8 is 50 mm. A metal colour selection electrode 3 having apertures 7 is situated at a distance $a_1$ of 9 mm from the inner surface 2 of the display window 1. As is known, phosphors luminescing in the colours red, green and blue are provided on the inner surface 2. For a true colour reproduction it is necessary for the colour selection electrode to be positioned accurately at a previously determined nominal distance $a_1$ from the inner surface 2 of the display window 1. This applies in particular to the critical areas near the corners of the display window. Fixing this distance is carried out by means of the measurement of the capacitance of a capacitor. The capacitor is formed by a circular measuring electrode 4 surrounded by a screening electrode 6. The counter electrode of the capacitor is formed by the colour selection electrode 3. If the glass thickness $a_2$ of the display window 1 is accurately constant, hence the contribution of the display window to the overall capacitance is constant, capacitance variations are directly the result of variations in the distance $a_1$. However, if variations occur in the glass thickness $a_2$, a capacitance variation also occurs. It is not clear as such from the measurement whether a capacitance variations is the result of a variation in the glass thickness $a_2$ or a variation in the distance $a_1$.

A solution to this problem is given by a method according to the invention. In such a method, capacitance variations as a result of variations with respect to the nominal glass thickness up to at most 15% are negligible with respect to capacitance variations as a result of variations in the distance $a_1$.

FIG. 2 is a plan view of the arrangement shown in FIG. 1. The diagonal of the display window 1 is denoted by A. The centre M of the circular measuring electrode 4 having a diameter of approximately 26 mm is situated substantially on the diagonal A of the display window 1. The centre N of the circular screening electrode 6 having a diameter of approximately 81 mm is also positioned substantially on the diagonal A. The screening electrode 6 is positioned with respect to the corner of the display window 1 in such manner that the screening electrode 6 substantially engages the projection S of the colour selection electrode 3 on the display window 1. The centre M of the measuring electrode 4 has moved along the diagonal A in a direction towards the corner over a distance of 3.5 mm with respect to the centre N of the screening electrode 6. The distance of 3.5 mm between the centres M and N is termed the eccentricity of the measuring electrode 4 with respect to the screening electrode 6. A thin annular slot 13 having a width of 80 μm is present between the measuring electrode 4 and the screening electrode 6. At the given nominal values of $a_1=9$ mm, $a_2=12$ mm and $a_3=50$ mm, and with the diameter of 81 mm of the screening electrode 6 and the eccentricity of 3.5 mm of the screening electrode 6 relative to the measuring electrode 4, the error in the measured distance $a_1$ as a result of glass thickness variations is minimum.

The diameter of the measuring electrode 4 is determined substantially by the size of the area over which variations in the distance between the inner surface of the display window 1 and the colour selection electrode 3 are to be determined. In addition, the value of the capacitance and hence the sensitivity of the device is determined by the size of the measuring electrode 4. It has been found that the dimension of the measuring electrode with respect to the optimum dimensions of the screening electrode are not particularly critical.

It has been found that for diameters of the measuring electrode 4 between approximately 14 and 30 mm the same optimum diameter of the screening electrode 6 can be chosen. The diameter of the measuring electrode is preferably chosen to be equal to approximately 26 mm.

FIG. 3 shows the relationship between the optimum outside dimensions d of the screening electrode and the nominal distance $a_1$ between the facing surfaces of the colour selection electrode and the display window for a number of given nominal glass thicknesses and heights of the upright edge of the display window.

The lines A, B and C denote the relationship between the optimum outside dimensions d and the distance $a_1$ with the height of the upright edge of the display window of approximately 50 mm for nominal glass thicknesses of 9, 12 and 15 mm, respectively.

From this figure it can be derived, for example, from line B that for nominal distances $a_1$ between approximately 8 and 16 mm, a value for the outside dimensions of the screening electrode has to be chosen between approximately 77 and 105 mm, which value is determined according to a substantially linear relationship with the said distance $a_1$.

The line D shows the relationship between the optimum outside dimensions d and the distance $a_1$ with a height of the upright edge of the display window of approximately 35 mm for a nominal glass thickness of the display window of 12 mm.

The eccentricity of the measuring electrode with respect to the screening electrode is determined by the glass thickness and the height of the upright edge of the display window. The eccentricity for the lines A, B, C and D shown in FIG. 3 is approximately 1.5, 3.5, 4.5 and 7 mm, respectively.

FIG. 4 is a plan view of another embodiment having a circular measuring electrode and a non-circular screening electrode according to the arrangement shown in FIG. 1. FIG. 4 is a plan view of a corner of a display window 20 of a colour television display tube. The diagonal of the display window 20 is denoted by B. A circular measuring electrode 21 is provided on the outer surface of the display window 20, the centre P of the electrode being substantially on the diagonal B of the display window. A screening electrode 22 is provided around the measuring electrode 21. A thin annular slot 23 is present between the measuring electrode 21 and the screening electrode 22. The screening electrode 22 is a non-circular electrode which is symmetrical with respect to the diagonal B. The distance from the outside of the screening electrode 22 to the centre P of the measuring electrode 20 increases proceeding from the corner towards the centre of the display screen. For the outside dimensions of the screening electrode 22 such a value is chosen, dependent on the given nominal glass thickness and height of the upright edge of the display window and the nominal distance between the facing surfaces of the colour selection electrode and the display window, that the error in the said distance to be measured as a result of glass thickness variations is minimum.

In addition to the embodiments shown in FIG. 2 and FIG. 4 it is also possible to use a non-circular measuring electrode which is arranged eccentrically in a non-circular screening electrode.

FIG. 5 is a sectional view of a device for carrying out a method according to the invention. The device is provided on the outer surface 31 of the display window 30. The device comprises a box-shaped holder 32. The open side of the holder 32 has a rubber rim 33. The end 34 of the rim 33 is considerably flattened so as to produce a vacuum-tight engagement against the outer surface 31 of the display window 30. The holder 32 may be made from metal or synthetic resin. If the holder 32 is of synthetic resin, the flexible rim may advantageously form part of the holder 32. A supporting member 37 supported by a rubber ring 35 is provided in the holder 32. The supporting member 37 consists of a flexible layer of synthetic resin, for example epoxy resin, which bears on the flexible ring 35. A metal measuring electrode 38 having a diameter c of 26 mm is provided on the supporting member 37. A screening electrode 39 having a diameter d of 81 mm surrounds the measuring electrode 38. The measuring electrode 38 and the screening electrode 39 consist of thin copper plates the surfaces of which are reinforced with rhodium and the free surfaces of which are covered with a layer of gold, 2 μm thick.

The measuring electrode 38 may be, for example, circular and have a diameter between 14 and 30 mm. The diameter d of the screening electrode 39 is determined by the nominal glass thickness $a_2$, the height of the upright edge $a_3$ and the previously adjusted distance $a_1$ between the inner surface 40 of the display window 30 and the colour selection electrode 41. In the present case, $a_1=9$ mm, $a_2=12$ mm and $a_3=50$ mm. The thickness of the supporting member 37 is approximately 400

μm, the thickness of the measuring electrode 38 and the screening electrode 39 is approximately 18 μm. A small annular slot 42 is present between the measuring electrode 38 and the screening electrode 39 and has a width of approximately 80 μm. The slot 42 can be filled with a ring of synthetic resin so as to maintain a good mutual position of the measuring electrode 38 and the screening electrode 39.

In order to prevent pollution of the slot 42 and hence shortcircuit between the measuring electrode 38 and the screening electrode 39, the electrodes may be covered with a thin layer of synthetic resin. Alternatively short-circuits between the measuring electrode 38 and the screening electrode 39 may be prevented by covering the measuring electrode 38 with an insulating layer of synthetic resin in a thickness of, for example, 400 μm. The screening electrode 39 is then provided on that layer of synthetic resin. In this case the circular aperture in the screening electrode must be provided with a wear-resistant insulator of, for example, quartz.

In order to ensure a fixed engagement of the electrodes against the outer surface 31 of the display window 30, the holder 32 is evacuated via a pumping connection 43 provided in the wall. The leads 44 and 45 serve to supply electric voltages to the measuring electrode 38 and the screening electrode 39 and are led out via a vacuum-tight connection 46 in the wall of the holder 32.

Measuring the capacitance of the capacitor is carried out by means of methods generally known for this purpose, for example, by means of a bridge circuit which is fed with alternating voltage.

Variations in the distance between the inner surface 40 of the display window 30 and the colour selection electrode 41 of approximately 30 μm can be established as such by means of the device described.

What is claimed is:

1. A capacitive method of measuring variations in a previously adjusted nominal distance between facing surfaces of a color selection electrode and a substantially rectangular, planar portion of a display window of a color television display tube, said planar portion being made of glass of a nominal thickness and the display window having an edge portion extending in a direction normal to the plane of the planar portion, said method comprising the steps of positioning, near one corner of the planar portion on the surface thereof remote from the color selection electrode, a metal measuring electrode and a metal screening electrode disposed about and surrounding said measuring electrode, said measuring and screening electrodes being arranged such that the center of said measuring electrode is spaced from the center of said screening electrode along a diagonal line extending from said one corner to the opposite corner of the planar portion, to thereby form a capacitor defined by said color selection electrode and said measuring electrode, said screening electrode having outside dimensions such that variations in the thickness of the planar portion from said nominal glass thickness of at most 15% result in variations in the capacitance of said capacitor which are negligible with respect to variations in the capacitance of said capacitor resulting from variations in the distance between the facing surfaces of said color selection electrode and the planar portion of the window from said nominal distance, and measuring the capacitance of the capacitor formed by said color selection electrode and said measuring electrode.

2. The method according to claim 1 wherein said measuring electrode and said screening electrode are symmetrical with respect to said diagonal line and the center of said measuring electrode is disposed on said diagonal line at a position between the center of said screening electrode and said corner.

3. The method according to claim 1 or 2 wherein said measuring and screening electrodes are circular.

4. The method according to claim 3 wherein the nominal glass thickness is between approximately 8 mm and 16 mm, the dimension of the edge portion in the direction normal to the plane of said planar portion is between approximately 30 mm and 60 mm and said nominal distance between said facing surfaces is between approximately 5 mm and 20 mm, and wherein the diameter of said screening electrode is dependent on said nominal distance and increases substantially linearly therewith, and the distance between the centers of said screening and measuring electrodes is determined by said nominal glass thickness and said height of said upright edge and is substantially independent of the diameter of said screening electrode.

5. An apparatus for capacitively measuring the distance between the facing surfaces of a color selection electrode and a substantially rectangular glass display window of a display tube, said apparatus comprising a planar, metal measuring electrode, a planar, metal screening electrode disposed about and surrounding said measuring electrode such that the center of said screening electrode is spaced from the center of said measuring electrode, means for applying said measuring and screening electrodes onto the surface of said display window remote from said color selection electrode near one corner of said window such that said centers of said screening and measuring electrodes lie substantially on a diagonal line extending from said one corner to an opposite corner of said window to thereby form a capacitor defined by said color selection electrode and said measuring electrode, and means for applying an alternating voltage to said measuring electrode.

6. The apparatus according to claim 5 wherein said applying means includes a housing having an opening on one side thereof, and means for supporting said screening and measuring electrodes in said housing opposite said opening and in engagement with the surface of said display window.

7. The apparatus according to claim 6 wherein said screening and measuring electrodes are supported by said supporting means in a position such that the center of said measuring electrode is disposed between the center of said screening electrode and said one corner of said display window.

8. The apparatus according to claim 6 or 7 wherein said measuring electrode is circular and said screening electrode is annular and disposed about said measuring electrode.

* * * * *